United States Patent
Lee et al.

(10) Patent No.: US 9,030,970 B2
(45) Date of Patent: May 12, 2015

(54) METHOD AND APPARATUS FOR TRANSMITTING UPLINK CONTROL INFORMATION IN WIRELESS COMMUNICATION SYSTEM

(75) Inventors: Hyun Woo Lee, Anyang-si (KR); Sung Ho Moon, Anyang-si (KR); Jae Hoon Chung, Anyang-si (KR); Seung Hee Han, Anyang-si (KR)

(73) Assignee: LG Electronics Inc., Seoul (KR)

( * ) Notice: Subject to any disclaimer, the term of this patent is extended or adjusted under 35 U.S.C. 154(b) by 307 days.

(21) Appl. No.: 13/574,762

(22) PCT Filed: Jan. 27, 2011

(86) PCT No.: PCT/KR2011/000565
§ 371 (c)(1),
(2), (4) Date: Jul. 23, 2012

(87) PCT Pub. No.: WO2011/093650
PCT Pub. Date: Aug. 4, 2011

(65) Prior Publication Data
US 2012/0294268 A1    Nov. 22, 2012

Related U.S. Application Data

(60) Provisional application No. 61/298,553, filed on Jan. 27, 2010, provisional application No. 61/391,686, filed on Oct. 11, 2010.

(51) Int. Cl.
| | | |
|---|---|---|
| H04L 12/28 | (2006.01) | |
| H03M 13/00 | (2006.01) | |
| H04L 1/00 | (2006.01) | |
| H04L 1/08 | (2006.01) | |
| H04J 1/16 | (2006.01) | |
| H03M 13/09 | (2006.01) | |
| H03M 13/13 | (2006.01) | |
| H03M 13/23 | (2006.01) | |
| H04L 5/00 | (2006.01) | |

(52) U.S. Cl.
CPC .......... H03M 13/6525 (2013.01); H03M 13/09 (2013.01); H03M 13/13 (2013.01); H03M 13/136 (2013.01); H03M 13/23 (2013.01); H04L 5/0053 (2013.01); H04L 1/0057 (2013.01); H04L 1/0073 (2013.01); H04L 1/08 (2013.01)

(58) Field of Classification Search
USPC ................... 370/252, 278, 329, 430
See application file for complete search history.

(56) References Cited

U.S. PATENT DOCUMENTS

| | | | |
|---|---|---|---|
| 2005/0232138 A1 | 10/2005 | Byun et al. | |
| 2009/0129330 A1 | 5/2009 | Kim et al. | |
| 2015/0036645 A1* | 2/2015 | Shin et al. | ...................... 370/329 |

FOREIGN PATENT DOCUMENTS

| | | |
|---|---|---|
| WO | WO 2009/020358 | 2/2009 |
| WO | WO 2009/099301 | 8/2009 |

* cited by examiner

*Primary Examiner* — John Pezzlo
(74) *Attorney, Agent, or Firm* — McKenna Long & Aldridge LLP

(57) ABSTRACT

A method and apparatus for transmitting uplink control information in a wireless communication system is disclosed. A method for transmitting uplink control information in a mobile station of a wireless communication system includes performing reverse repetition coding with respect to first uplink control information, and performing joint coding with respect to the reverse repetition coded first uplink control information and second uplink control information. The first uplink control information has higher priority than the second uplink control information.

18 Claims, 5 Drawing Sheets

METHOD AND APPARATUS FOR TRANSMITTING UPLINK CONTROL INFORMATION IN WIRELESS COMMUNICATION SYSTEM

This Application is a 35 U.S.C. §371 National Stage Entry of International Application No. PCT/KR2011/000565, filed Jan. 27, 2011 and claims the benefit of U.S. Provisional Application Nos. 61/298,553, filed Jan. 27, 2010, 61/391,686, filed Oct. 11, 2010, and Korean Application No: 10-2011-0004940, filed Jan. 18, 2011, all of which are incorporated by reference in their entirety herein.

TECHNICAL FIELD

The present invention relates to a wireless communication system, and more particularly, to a method and apparatus for transmitting uplink control information in a wireless communication system.

BACKGROUND ART

First, the frame structure of a wireless communication system will be described with reference to FIG. 1. FIG. 1 is a diagram showing a frame structure of a Long Term Evolution (LTE) system. As shown in FIG. 1, one frame includes 10 subframes and one subframe includes two slots. A time consumed for transmitting one subframe is referred to as a Transmission Time Interval (TTI). For example, one subframe may have a TTI of 1 ms and one slot may have a TTI of 0.5 ms.

One slot includes a plurality of Orthogonal Frequency Division Multiplexing (OFDM) symbols. The OFDM symbol may be also called an OFDMA symbol, a Single Carrier-FDMA (SC-FDMA) symbol, or a symbol interval.

One slot includes 6 or 7 OFDM symbols according to the length of a Cyclic Prefix (CP). The LTE system includes a normal CP and an extended CP. In the case of using the normal CP, one slot includes 7 OFDM symbols and, in the case of using the extended CP, one slot includes six OFDM symbols. The extended CP is used when delay spread is wide.

A mobile station may transmit uplink control information through a Physical Uplink Control Channel (PUCCH). The uplink control information may include a variety of information such as a Scheduling Request (SR), an Acknowledgement/Non-Acknowledgement (ACK/NACK) signal, a Channel Quality Indicator (CQI), a Precoding Matrix Indicator (PMI) and a Rank Indicator (RI). The PUCCH is used to carry a variety of control information according to formats.

There is a need for a method for efficiently transmitting a variety of uplink control information.

DISCLOSURE OF INVENTION

Technical Problem

An object of the present invention devised to solve the problem lies on a method and apparatus for efficiently transmitting uplink control information in a wireless communication system.

Solution to Problem

The object of the present invention can be achieved by providing a method for transmitting uplink control information in a mobile station of a wireless communication system including performing reverse repetition coding with respect to first uplink control information, and performing joint coding with respect to the reverse repetition coded first uplink control information and second uplink control information. The first uplink control information has higher priority than the second uplink control information.

The first uplink control information and the second uplink control information may be transmitted in one transmission format.

The performing the reverse repetition coding may include performing reverse repetition coding such that the number of bits of the first uplink control information becomes a predetermined bit number.

The predetermined bit number may be set in consideration of a maximum payload size supportable by channel coding defined in the transmission format.

The performing of the reverse repetition coding may include performing reverse repetition coding such that a sum of the numbers of bits of the first uplink control information and the second uplink control information becomes a predetermined bit number.

The first uplink control information may be a Scheduling Request (SR) and the second uplink control information may be an Acknowledgement/Non-Acknowledgement (ACK/NACK) signal.

The first uplink control information may be set to 1 if a scheduling request is present as positive Scheduling Request (SR) transmission in the mobile station and may be set to 0 if the scheduling request is absent as negative Scheduling Request (SR) transmission in the mobile station.

The first uplink control information may be a Scheduling Request (SR) and the second uplink control information may be a Channel Quality Indicator (CQI).

The first uplink control information may be an Acknowledgement/Non-Acknowledgement (ACK/NACK) signal and the second uplink control information may be a Channel Quality Indicator (CQI).

In another aspect of the present invention, provided herein is a mobile station of a wireless communication system including a processor configured to perform reverse repetition coding with respect to first uplink control information and joint coding with respect to the reverse repetition coded first uplink control information and second uplink control information, and a transmission module configured to transmit the joint coded first uplink control information and second uplink control information. The first uplink control information has higher priority than the second uplink control information.

Advantageous Effects of Invention

According to the embodiments of the present invention, it is possible to guarantee performance of uplink control information with high priority by performing separate channel coding with respect to the uplink control information with high priority in the case where two or more pieces of uplink control information are simultaneously transmitted.

BRIEF DESCRIPTION OF DRAWINGS

The accompanying drawings, which are included to provide a further understanding of the invention, illustrate embodiments of the invention and together with the description serve to explain the principle of the invention.

In the drawings.

BEST MODE FOR CARRYING OUT THE INVENTION

Reference will now be made in detail to the preferred embodiments of the present invention, examples of which are illustrated in the accompanying drawings. The detailed description set forth below in connection with the appended drawings describes exemplary embodiments and is not intended to represent the only embodiments through which the concepts explained in these embodiments can be practiced. The detailed description includes details for the purpose of providing an understanding of the present invention. However, it will be apparent to those skilled in the art that these teachings may be implemented and practiced without these specific details. For example, although a 3rd Generation Project Partnership (3GPP) Long Term Evolution (LTE) system is described in detail as a mobile communication system in the following description, the present invention is applicable to other mobile communication systems such as an IEEE 802.16 system, except for unique matters of the 3GPP LTE system.

In some instances, well-known structures and devices are omitted in order to avoid obscuring the concepts of the present invention and the important functions of the structures and devices are shown in block diagram form. The same reference numbers will be used throughout the drawings to refer to the same or like parts.

In the following description, assume that "mobile station" is a generic term for a mobile or fixed user-end device such as a user equipment (UE), a mobile station (MS) and the like. In addition, assume that "base station (BS)" is a generic name for any node of a network end which communicates with a mobile station, such as a Node B (NB), an enhanced Node B (eNB) and the like.

Figure 1:
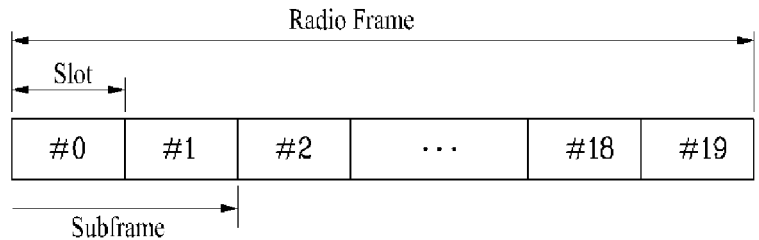
FIG. 1 is a diagram showing a frame structure of a Long Term Evolution (LTE) system.
Figure 2:
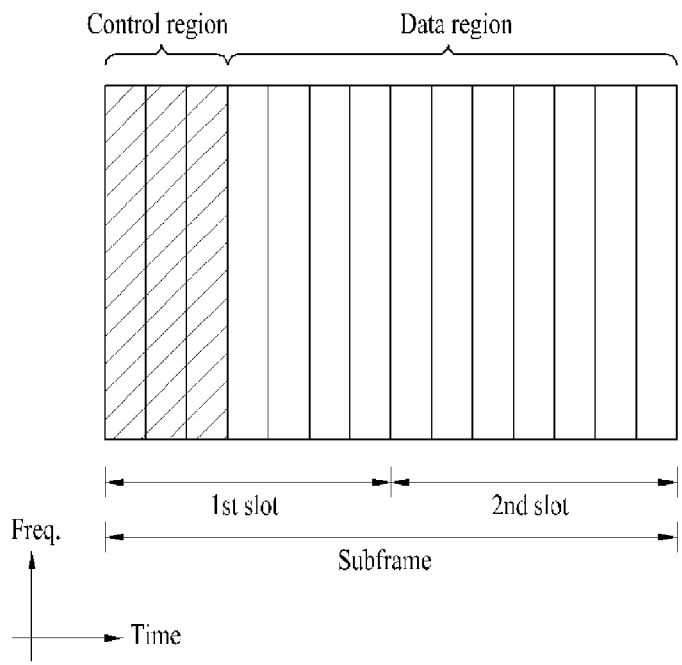
FIG. 2 is a diagram showing the structure of a downlink subframe.

First, the structure of a downlink subframe and an uplink subframe will be described with reference to FIGS. 2 and 3.

The downlink subframe includes two slots in a time region. In the case of using a normal Cyclic Prefix (CP), each slot includes 7 OFDM symbols. A maximum of three OFDM symbols (a maximum of 4 OFDM symbols in a bandwidth of 1.4 MHz) of a foremost portion of a first slot within a subframe corresponds to a control region to which a control channel is allocated. The remaining OFDM symbols correspond to a data region to which a Physical Downlink Shared Channel (PDSCH) is allocated.

A Physical Downlink Control Channel (PDCCH) may carry resource allocation and transmission format of a Downlink Shared Channel (DL-SCH), resource allocation information of an Uplink Shared Channel (UL-SCH), paging information of a Paging Channel (PCH), system information on the DL-SCH, resource allocation of a higher layer control message such as a Random Access Response (RAR) transmitted on the PDSCH, a set of transmit power control commands for individual mobile stations in a certain mobile station group, etc. A plurality of PDCCHs may be transmitted within the control region. The mobile station may monitor the plurality of PDCCHs. The PDCCHs are transmitted as an aggregate of one or several contiguous control channel elements (CCEs). The CCE is a logical allocation unit used to provide a coding rate based on the state of a radio channel to the PDCCHs. The CCE corresponds to a plurality of resource element groups. The format of the PDCCH and the number of available bits are determined based on a correlation between the number of CCEs and the coding rate provided by the CCEs.

A base station determines a PDCCH format according to a DCI to be transmitted to the mobile station, and attaches a Cyclic Redundancy Check (CRC) to control information. The CRC is masked with a Radio Network Temporary Identifier (RNTI) according to an owner or usage of the PDCCH. If the PDCCH is for a specific mobile station, a cell-RNTI (C-RNTI) of the mobile station may be masked to the CRC. Alternatively, if the PDCCH is for a paging message, a paging indicator identifier (P-RNTI) may be masked to the CRC. If the PDCCH is for system information (system information block (SIB)), a system information identifier and a system information RNTI (SI-RNTI) may be masked to the CRC. To indicate a random access response that is a response for transmission of a random access preamble of the mobile station, a random access-RNTI (RA-RNTI) may be masked to the CRC.

Figure 3:
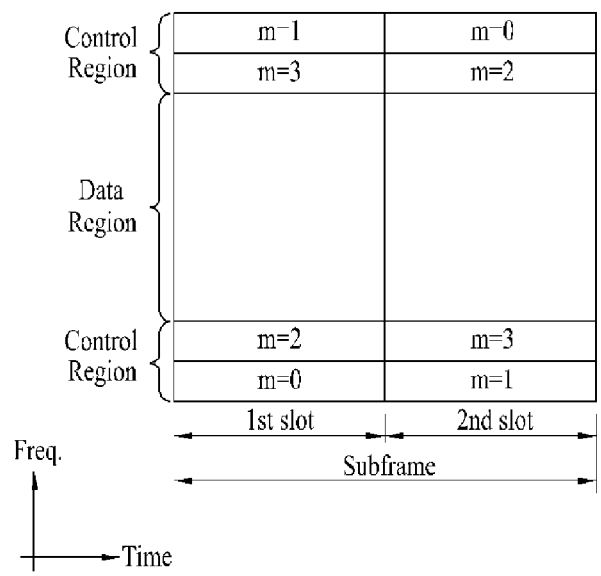
FIG. 3 is a diagram showing the structure of an uplink subframe.

FIG. 3 is a diagram showing the structure of an uplink subframe. The uplink subframe may be frequency divided into a control region and a data region. A Physical Uplink Control Channel (PUCCH) for transmitting uplink control information is allocated to the control region. A Physical uplink Shared Channel (PUSCH) for transmitting data is allocated to the data region. In the 3GPP LTE Rel-8/9, in order to maintain single carrier characteristics, one mobile station does not simultaneously transmit the PUCCH and the PUSCH.

The PUSCH is mapped to an Uplink Shared Channel (UL-SCH which is a transport channel). Uplink data transmitted on the PUSCH may be a transport block which is a data block for the UL-SCH transmitted during a TTI. The transport block may be user information. The uplink data may be multiplexed data. The multiplexed data may be obtained by multiplexing the transport block for the UL-SCH and control information. For example, the multiplexed control information includes a Channel Quality Indicator (CQI), a Precoding Matrix Indicator (PMI) and a Rank Indicator (RI), etc. Alternatively, the uplink data may include the control information alone.

Next, the PUCCH will be described.

The PUCCH for one mobile station is allocated to a resource block (RB) pair in a subframe. RBs belonging to the RB pair occupy different subcarriers in a first slot and a second slot. A frequency occupied by RBs belonging to the RB pair allocated to the PUCCH is changed based on a slot boundary. This means that the RB pair allocated to the PUCCH is "frequency-hopped" at a slot edge. A mobile station transmits uplink control information through different subcarriers according to time so as to obtain frequency diversity gain. m denotes a location index indicating a logical frequency region location of the RB pair allocated to the PUCCH within the subframe.

The PUCCH carries a variety of control information according to formats. The PUCCH format 1 carries a Scheduling Request (SR). In this case, an On-Off Keying (OOK) scheme is applicable. The PUCCH format 1a carries an Acknowledgement/Non-Acknowledgement (ACK/NACK) signal modulated using a Binary Phase Shift Keying (BPSK) scheme with respect to one codeword. The PUCCH format 1b carries an ACK/NACK signal modulated using a Quadrature Phase Shift Keying (QPSK) scheme with respect to two codewords. The PUCCH format 2 carries a CQI modulated using the QPSK scheme. The PUCCH formats 2a and 2B carrier the CQI and the ACK/NACK signal.

Table 1 shows a modulation scheme and the number of bits per subframe according to PUCCH formats.

TABLE 1

| PUCCH format | Modulation scheme | Number of bits per subframe, M bit |
| --- | --- | --- |
| 1 | N/A | N/A |
| 1a | BPSK | 1 |
| 1b | QPSK | 2 |
| 2 | QPSK | 20 |
| 2a | QPSK + BPSK | 21 |
| 2b | QPSK + QPSK | 22 |

Table 2 shows the number of OFDM symbols used as a PUCCH demodulation reference signal per slot.

TABLE 2

| PUCCH format | Normal cyclic prefix | Extended cyclic prefix |
| --- | --- | --- |
| 1, 1a, 1b | 3 | 2 |
| 2 | 2 | 1 |
| 2a, 2b | 2 | N/A |

Table 3 shows the locations of OFDM symbols to which demodulation reference signals are mapped according to PUCCH formats.

TABLE 3

| PUCCH format | set of values for - | |
| --- | --- | --- |
| | Normal cyclic prefix | Extended cyclic prefix |
| 1, 1a, 1b | 2, 3, 4 | 2, 3 |
| 2, 2a, 2b | 1, 5 | 3 |

The ACK/NACK signal may be transmitted using different resources including different cyclic shift values and different Walsh/Discrete Fourier Transform (DFT) orthogonal codes with respect to a Computer Generated Constant Amplitude Zero Auto Correlation (CG-CAZAC) sequence as a basic sequence on a per mobile station basis. When the numbers of available cyclic shift values and Walsh/DFT codes are respectively 6 and 3, a total of 18 mobile stations each having a single antenna port may be multiplexed within one PRB.

Next, a method of transmitting uplink control information in a wireless communication system according to an embodiment of the present invention will be described.

In the embodiment of the present invention, a method of combining and transmitting a plurality of pieces of uplink control information through a PUCCH is proposed.

For example, if the ACK/NACK signal is set to be transmitted through the PUCCH, information other than the ACK/NACK signal may be transmitted within the same subframe. In this case, there is a need for a method for simultaneously transmitting the ACK/NACK signal and the other information without damaging the single carrier properties of SC-FDMA. At this time, information which needs to be transmitted simultaneously with the ACK/NACK signal includes an SR, a Scheduling Request Indicator (SRI), a CQI, etc. As another example, if the CQI is set to be transmitted through the PUCCH, information other than the CQI signal may be transmitted within the same subframe. Even in this case, there is a need for a method for simultaneously transmitting the CQI and the other information without damaging the single carrier properties of SC-FDMA. At this time, information which needs to be transmitted simultaneously with the CQI includes an SR, an SRI, etc.

According to the embodiment of the present invention, in the case where two or more pieces of uplink control information need to be simultaneously transmitted through a channel which may transmit relatively much information, such as a DFT based new PUCCH format or a PUCCH format 2 of LTE Rel-8, the mobile station performs separate coding with respect to one or more pieces of information (e.g., SR) having relative high predefined priority or occupying a small number of bits between two or more pieces of uplink control information, collects the uplink control information which is subjected to separate channel coding and the uplink control information which is not subjected to separate channel coding, performs channel coding with respect to the collected uplink control information through joint coding, and transmits the channel-coded uplink control information. At this time, the separate channel coding may include repetition coding, linear block coding, convolutional coding, Reed-Muller coding, etc.

Alternatively, uplink control information which is not subjected to separate channel coding may be channel-coded, the uplink control information which is subjected to separate channel coding and the uplink control information which is not subjected to separate channel coding may be mapped to symbols and subcarriers in predetermined order so as to be distinguished from each other, and the uplink control information may be transmitted.

That is, performance of one or more pieces of uplink control information with relatively high priority or occupying a small number of bits is improved through separate channel coding. For example, the priority is increased in order of SR, ACK/NACK signal, and CQI. As an example of the priority, one or more definitions may be used as follows. The priority of the RI is higher than that of the CQI or the PMI. The priority of a wideband CQI/PMI is higher than that of a subband CQI. The priority of original information is higher than that of differential information. The priority of information having a long period is higher than that of information having a short period. In a Multiple Input Multiple Output (MIMO) system, information about a first codeword is higher than that of information about the other codewords.

As separate channel coding of one or more pieces of uplink control information with relatively high priority or occupying a small number of bits between two or more pieces of uplink control information, repetition coding may be used.

That is, in the case where two or more pieces of uplink control information need to be simultaneously transmitted through a channel which may transmit relatively much information, such as a DFT based new PUCCH format or a PUCCH format 2 of LTE Rel-8, the mobile station performs repetition coding with respect to one or more pieces of information (e.g., SR) having relative high predefined priority or occupying a small number of bits between two or more pieces of uplink control information, collects the uplink control information which is subjected to repetition coding and the uplink control information which is not subjected to separate channel coding, performs channel coding with respect to the collected uplink control information through joint coding, and transmits the channel-coded uplink control information. The DFT based new PUCCH format means a format in which ACK/NACK bits greater in number than the number of bits transmittable in the conventional PUCCH format 1a/1b may be transmitted. The detailed form and method of the format is not limited to the present invention.

That is, performance of one or more pieces of uplink control information with relatively high priority or occupying a small number of bits is improved through separate repetition coding.

Figure 4:
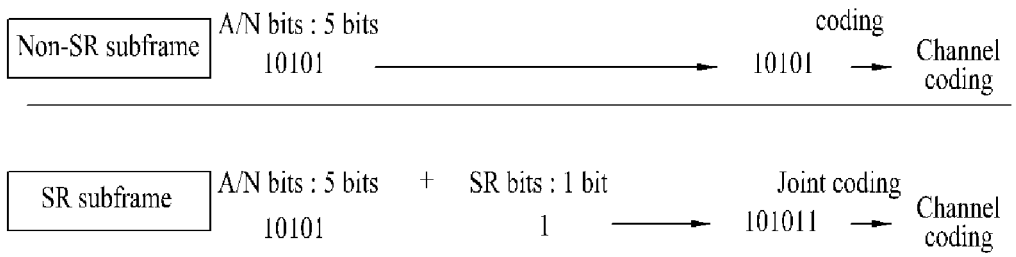
FIG. 4 is a diagram showing the case of simply joint coding a Scheduling Request (SR) and an Acknowledgement/Non-Acknowledgement (ACK/NACK) signal.

FIG. 4 is a diagram showing the case of simply joint coding an SR and an ACK/NACK signal.

In FIG. 4, the ACK/NACK signal and the SR are simultaneously transmitted in an SR subframe and the SR is not transmitted in a non-SR subframe. As shown in FIG. 4, in the case of simply joint coding the SR and the ACK/NACK signal, the mobile station may joint code the 1-bit SR with the ACK/NACK signal only in the SR subframe and transmit the SR and the ACK/NACK. The mobile station performs (32, 0) RM coding with circular buffer rate matching with respect to 10101 and generates and transmits 48 encoded bits in the non-SR subframe. In contrast, the 1-bit SR is joint coded with the ACK/NACK signal so as to generate 101011 and transmits 101011 after performing channel coding. Although the location of the SR bit is set to the rearmost side of the information in the description for convenience, the present invention is not limited thereto.

As shown in FIG. 4, if the number of ACK/NACK bits is 5, the number of bits of the result of simply joint coding the SR and the ACK/NACK signal becomes 6 bits. Then, the SR bit has the same performance as the ACK/NACK bits. Accordingly, performance deteriorates as compared to the case where the SR is separately transmitted using the PUCCH format 1) without uplink control information combination. The PUCCH format 1 detects whether or not a signal exists and has performance better than that of the format using constellation, such as BPSK or QPSK.

Accordingly, in the embodiment of the present invention, in order to improve the performance of the SR, the mobile station performs repetition channel coding or separate coding with respect to the SR bit before channel coding such that the sum of the SR bit and the ACK/NACK bits becomes X bits so as to configure SR and ACK/NACK information and performs channel coding with respect to the SR and ACK/NACK information using a scheme defined in the DFT based new PUCCH format.

At this time, the SR bit may be 1 in the case where a scheduling request is present as positive Scheduling Request (SR) transmission in a mobile station and may be 0 in the case where the scheduling request is absent as negative Scheduling Request (SR) transmission in a mobile station. In addition to repetition channel coding, simplex coding, RM coding, TBCC coding, turbo coding, etc. may be applied to the SR bit. X may be a predetermined value. For example, X may be 10. X may become a maximum payload size supportable by channel coding defined in the transmission format.

Alternatively, in the embodiment of the present invention, in order to improve the performance of the SR, the mobile station performs repetition channel coding or separate coding with respect to the SR bit before channel coding such that the SR bits become Y bits so as to configure SR and ACK/NACK information and performs channel coding with respect to the SR and ACK/NACK information using a scheme defined in the DFT based new PUCCH format.

At this time, the SR bit may be 1 in the case where a scheduling request is present as positive Scheduling Request (SR) transmission in a mobile station and may be 0 in the case where the scheduling request is absent as negative Scheduling Request (SR) transmission in a mobile station. In addition to repetition channel coding, simplex coding, RM coding, TBCC coding, turbo coding, etc. may be applied to the SR bit. X and Y may be predetermined values. For example, X may be 10 and Y may be 5. X may become a maximum payload size supportable by channel coding defined in the transmission format. Y may become a value less than a maximum payload size supportable by channel coding defined in the transmission format.

The setting of the Y bits in the repetition coding has the same effect as the case of fixing the number of repetitions of repetition coding in advance. The setting of the Y bits in the separate coding has the same effect as the case of fixing a coding rate in the separate coding.

In the present invention, in addition to the repetition coding or the separate coding of one or more pieces of information with relatively high priority or occupying a small number of bits between two or more pieces of uplink control information, all or a part of specific information with low priority may be dropped. In particular, if the size of joint coded information exceeds a maximum payload size, all or a part of specific information with low priority may be dropped. For example, information of a large unit with low priority may be a CQI and information of a small unit with low priority may be a subband CQI within a CQI.

Next, a method of coding uplink control information when simultaneously transmitting an ACK/NACK signal and an SR will be described with reference to FIGS. 5 and 6.

Figure 5:
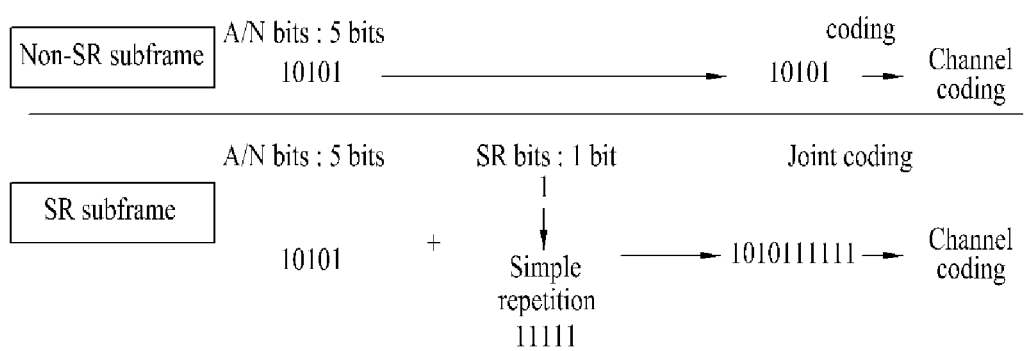
FIG. 5 is a diagram showing an example of a method of coding uplink control information according to an embodiment of the present invention in the case of transmitting an ACK/NACK signal and an SR in one transmission format.
Figure 6:
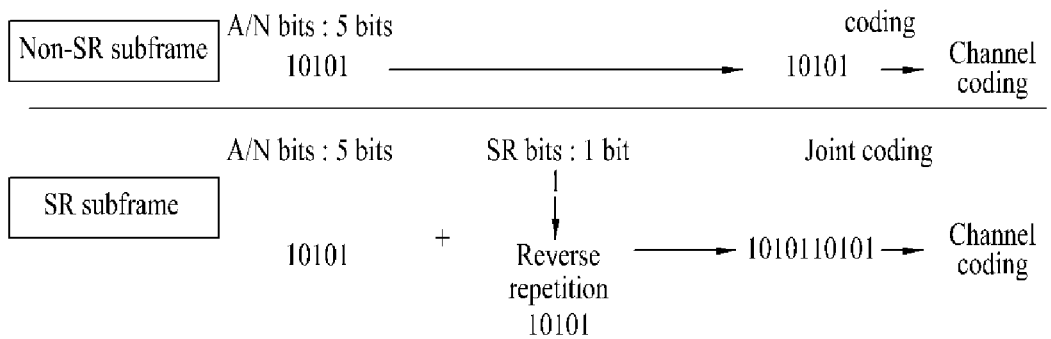
FIG. 6 is a diagram showing another example of a method of coding uplink control information according to an embodiment of the present invention in the case of simultaneously transmitting an ACK/NACK signal and an SR.

FIG. 5 is a diagram showing an example of a method of coding uplink control information according to an embodiment of the present invention in the case of transmitting an ACK/NACK signal and an SR in one transmission format, and FIG. 6 is a diagram showing another example of a method of coding uplink control information according to an embodiment of the present invention in the case of simultaneously transmitting an ACK/NACK signal and an SR.

In FIG. 5, the number of ACK/NACK bits is 5 and transmission information is 10101. The number of SR bits is 1 and transmission information is 1. It is assumed that X is set to 10 (or Y is set to 5).

The mobile station performs (32, 0) RM coding with circular buffer rate matching with respect to 10101 and generates and transmits 48 encoded bits in the non-SR subframe. In contrast, the 1-bit SR is repeated so as to generate 11111, is joint coded with the ACK/NACK signal so as to generate 1010111111, is subjected to channel coding, and is transmitted, in the SR subframe. Although the location of the SR bit is set to the rearmost side of the information in the description for convenience, the present invention is not limited thereto.

When two or more pieces of different information are transmitted in one physical structure or format (e.g., the DFT based new PUCCH format), it is possible to improve performance by performing repetition coding with respect to information with high priority or a small bit number.

In FIG. 6, the number of ACK/NACK bits is 5 and transmission information is 10101. The number of SR bits is 1 and transmission information is 1. It is assumed that X is set to 10 (or Y is set to 5).

The mobile station performs (32, 0) RM coding with circular buffer rate matching with respect to 10101 and generates and transmits 48 encoded bits in the non-SR subframe. In contrast, the 1-bit SR is repeated in the SR subframe. At this time, repetition is not simply performed, but a predetermined rule may be applied. In FIG. 6, an example in which a reverse bit of a preceding bit is repeated is shown. The mobile station performs reverse repetition coding with respect to the SR so as to generate 10101, performs joint coding with the ACK/NACK signal so as to generate 1010110101, performs channel coding with respect to 1010110101, and transmits the channel coded information. Although the location of the SR bit is set to the rearmost side of the information in the description for convenience, the present invention is not limited thereto.

Next, a method of coding uplink control information when simultaneously transmitting a CQI and an SR will be described with reference to FIGS. 7 and 8.

Figure 7:
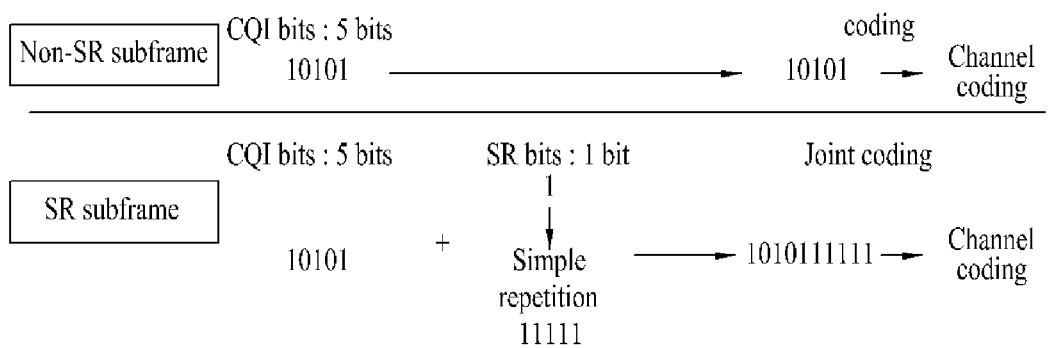
FIG. 7 is a diagram showing an example of a method of coding uplink control information according to an embodiment of the present invention in the case of simultaneously transmitting a Channel Quality Indicator (CQI) and an SR.
Figure 8:
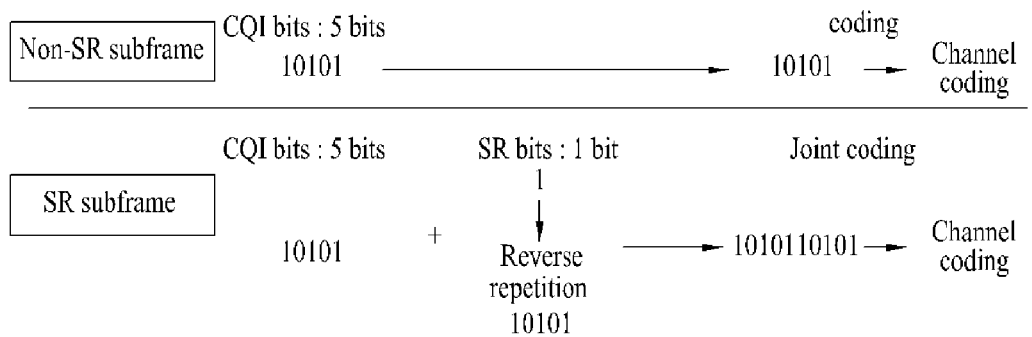
FIG. 8 is a diagram showing another example of a method of coding uplink control information according to an embodiment of the present invention in the case of simultaneously transmitting a CQI and an SR.

FIG. 7 is a diagram showing an example of a method of coding uplink control information according to an embodiment of the present invention in the case of simultaneously transmitting a CQI and an SR, and FIG. 8 is a diagram showing another example of a method of coding uplink control information according to an embodiment of the present invention in the case of simultaneously transmitting a CQI and an SR.

In FIG. 7, the number of CQI bits is 5 and transmission information is 10101. The number of SR bits is 1 and transmission information is 1. It is assumed that X is set to 10 (or Y is set to 5).

The mobile station performs (32, 0) RM coding with circular buffer rate matching with respect to 10101 and generates and transmits 48 encoded bits in the non-SR subframe. In contrast, the 1-bit SR is repeated so as to generate 11111, is joint coded with the CQI so as to generate 1010111111, is subjected to channel coding, and is transmitted, in the SR subframe. Although the location of the SR bit is set to the rearmost side of the information in the description for convenience, the present invention is not limited thereto.

When two or more pieces of different information are transmitted in one physical structure or format (e.g., the DFT based new PUCCH format), it is possible to improve performance by performing repetition coding with respect to information with high priority or a small bit number.

In FIG. 8, the number of CQI bits is 5 and transmission information is 10101. The number of SR bits is 1 and transmission information is 1. It is assumed that X is set to 10 (or Y is set to 5).

The mobile station performs (32, 0) RM coding with circular buffer rate matching with respect to 10101 and generates and transmits 48 encoded bits in the non-SR subframe. In contrast, the 1-bit SR is repeated in the SR subframe. At this time, repetition is not simply performed, but a predetermined rule may be applied. In FIG. 8, an example in which a reverse bit of a preceding bit is repeated is shown. The mobile station performs reverse repetition coding with respect to the SR so as to generate 10101, performs joint coding with the CQI so as to generate 1010110101, performs channel coding with respect to 1010110101, and transmits the channel coded information. Although the location of the SR bit is set to the rearmost side of the information in the description for convenience, the present invention is not limited thereto.

Next, a method of coding uplink control information when simultaneously transmitting a CQI and an ACK/NACK signal will be described with reference to FIGS. 9 and 10.

Figure 9:
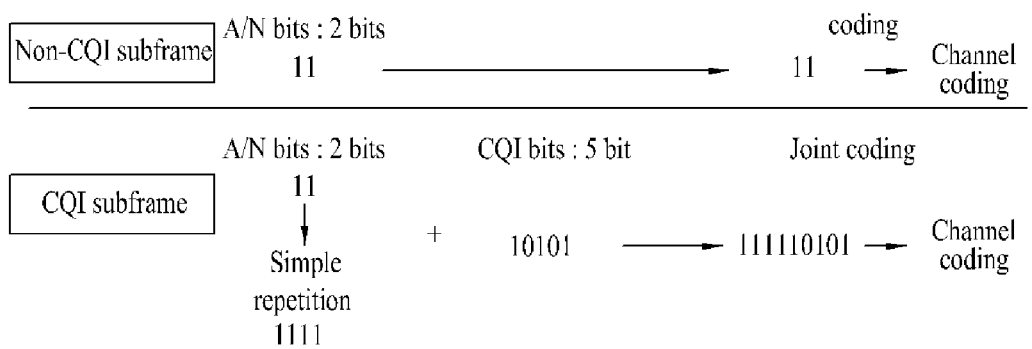
FIG. 9 is a diagram showing an example of a method of coding uplink control information according to an embodiment of the present invention in the case of simultaneously transmitting a CQI and an ACK/NACK signal.
Figure 10:
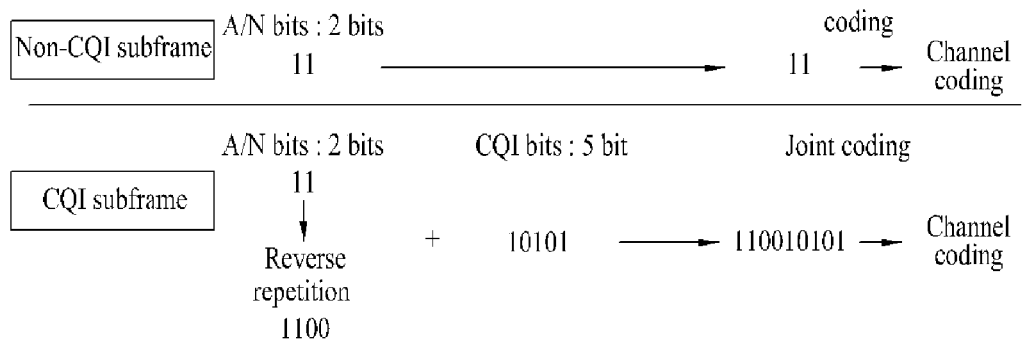
FIG. 10 is a diagram showing another example of a method of coding uplink control information according to an embodiment of the present invention in the case of simultaneously transmitting a CQI and an ACK/NACK signal.

FIG. 9 is a diagram showing an example of a method of coding uplink control information according to an embodiment of the present invention in the case of simultaneously transmitting a CQI and an ACK/NACK signal, and FIG. 10 is a diagram showing another example of a method of coding uplink control information according to an embodiment of the present invention in the case of simultaneously transmitting a CQI and an ACK/NACK signal.

In FIG. 9, the number of ACK/NACK bits is 2 and transmission information is 11. The number of CQI bits is 5 and transmission information is 10101. It is assumed that Y is set to 4 (or X is set to 9).

The mobile station performs (32, 0) RM coding with circular buffer rate matching with respect to 11 and generates and transmits 48 encoded bits in the non-CQI subframe. In contrast, the 2-bit ACK/NACK signal is repeated so as to generate 1111, is joint coded with the CQI so as to 111110101, is subjected to channel coding, and is transmitted, in the CQI subframe. Although the location of the CQI bit is set to the rearmost side of the information in the description for convenience, the present invention is not limited thereto.

In FIG. 10, the number of ACK/NACK bits is 2 and transmission information is 11. The number of CQI bits is 5 and transmission information is 10101. It is assumed that Y is set to 4 (or X is set to 9).

The mobile station performs (32, 0) RM coding with circular buffer rate matching with respect to 11 and generates and transmits 48 encoded bits in the non-CQI subframe. In contrast, the 2-bit ACK/NACK signal is repeated in the CQI subframe. At this time, repetition is not simply performed, but a predetermined rule may be applied. In FIG. 10, an example in which a reverse bit of a preceding bit is repeated is shown. The mobile station performs reverse repetition coding with respect to the ACK/NACK signal so as to generate 1100, performs joint coding with the CQI so as to generate 110010101, performs channel coding with respect to 110010101, and transmits the channel coded information. Although the location of the CQI bit is set to the rearmost side of the information in the description for convenience, the present invention is not limited thereto.

Figure 11:
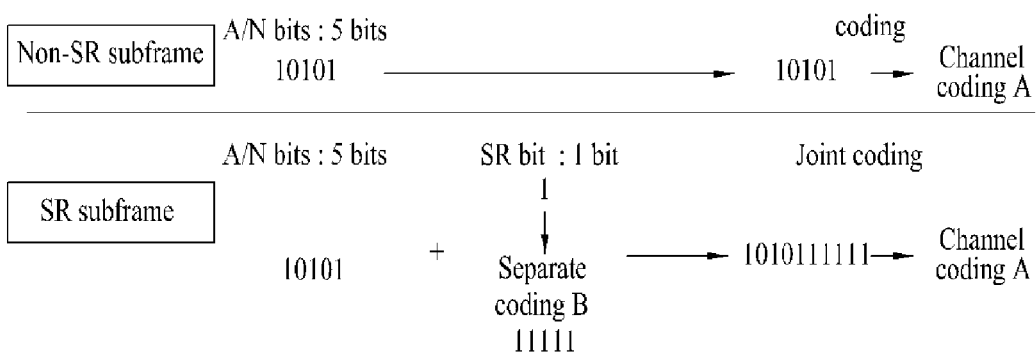
FIG. 11 is a diagram showing another example of a method of coding uplink control information according to an embodiment of the present invention in the case of transmitting an ACK/NACK signal and an SR in one transmission format.

FIG. 11 is a diagram showing another example of a method of coding uplink control information according to an embodiment of the present invention in the case of transmitting an ACK/NACK signal and an SR in one transmission format.

In FIG. 11, the number of ACK/NACK bits is 5 and transmission information is 10101. The number of SR bits is 1 and transmission information is 1. It is assumed that X is set to 10 (or Y is set to 5).

The mobile station performs (32, 0) RM coding with circular buffer rate matching with respect to 10101 and generates and transmits 48 encoded bits in the non-SR subframe. In contrast, the 1-bit SR is subjected to separate coding in the SR subframe. As separating coding, linear block coding or convolutional coding may be performed. In FIG. 11, separate coding B is performed with respect to the 1-bit SR so as to generate 11111, is joint coded with the ACK/NACK signal so as to generate 1010111111, is subjected to channel coding A, and is transmitted. Although the method of the separate coding B may be equal to the method of the channel coding A, the method of the separate coding B may be different from the method of the channel coding A in order to efficiently code a smaller number of pieces of information. Although the location of the SR bit is set to the rearmost side of the information in the description for convenience, the present invention is not limited thereto.

Figure 12:
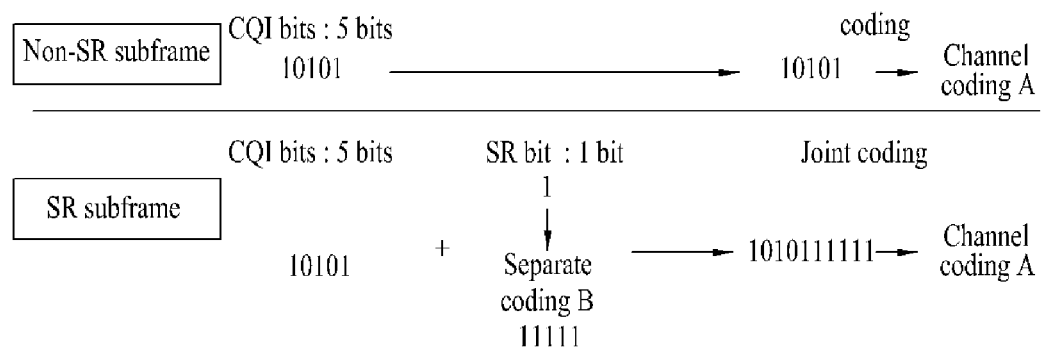
FIG. 12 is a diagram showing another example of a method of coding uplink control information according to an embodiment of the present invention in the case of simultaneously transmitting a CQI and an SR.

FIG. 12 is a diagram showing another example of a method of coding uplink control information according to an embodiment of the present invention in the case of simultaneously transmitting a CQI and an SR.

In FIG. 12, the number of CQI bits is 5 and transmission information is 10101. The number of SR bits is 1 and transmission information is 1. It is assumed that X is set to 10 (or Y is set to 5).

The mobile station performs (32, 0) RM coding with circular buffer rate matching with respect to 10101 and generates and transmits 48 encoded bits in the non-SR subframe. In contrast, the 1-bit SR is subjected to separate coding in the SR subframe. As separating coding, linear block coding or convolutional coding may be performed. In FIG. 12, separate coding B is performed with respect to the 1-bit SR so as to generate 11111, is joint coded with the CQI so as to generate 1010111111, is subjected to channel coding A, and is transmitted. Although the method of the separate coding B may be equal to the method of the channel coding A, the method of the separate coding B may be different from the method of the channel coding A in order to efficiently code a smaller number of pieces of information. Although the location of the SR bit is set to the rearmost side of the information in the description for convenience, the present invention is not limited thereto.

Figure 13:
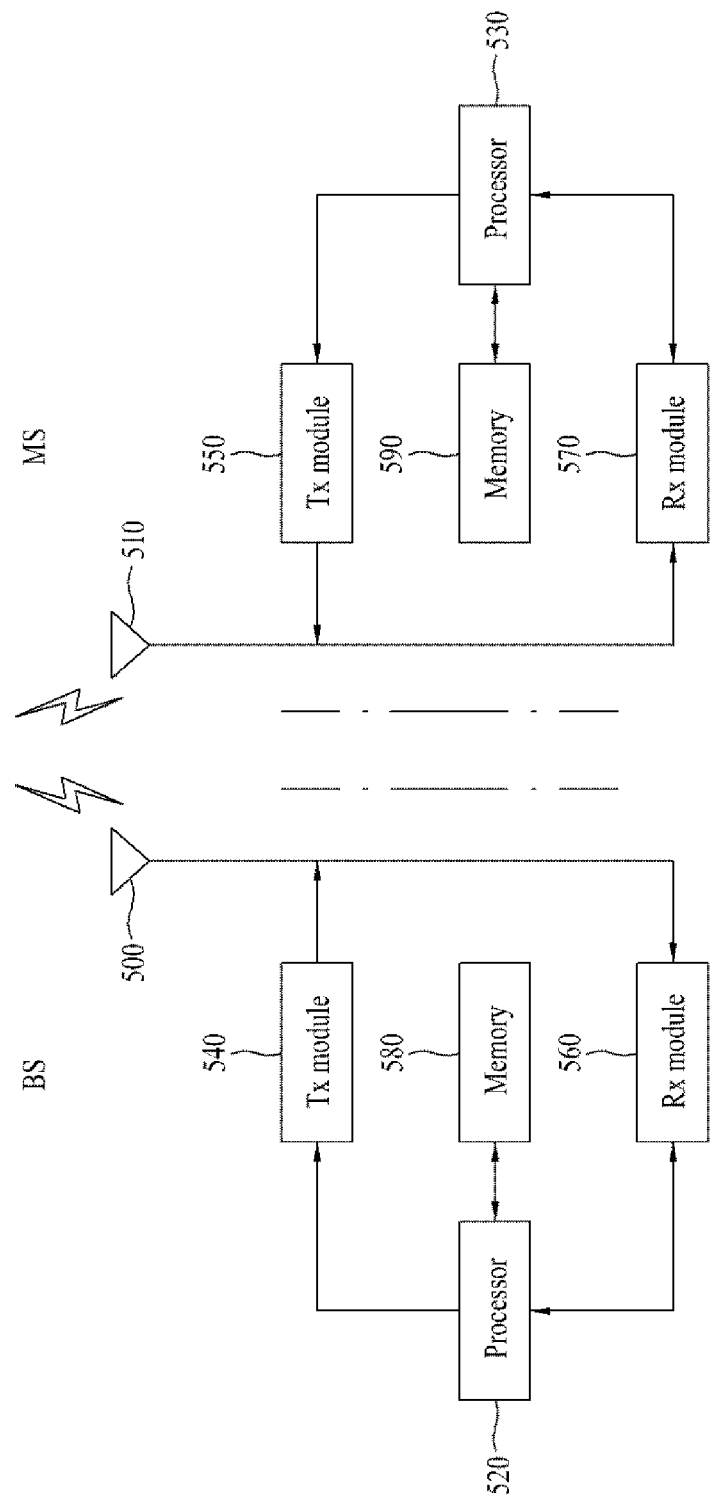
FIG. 13 is a diagram showing the configuration of a mobile stationmobile station and a base station through which the embodiments of the present invention can be implemented.

FIG. 13 is a diagram showing the configuration of a mobile station and a base station through which the embodiments of the present invention can be implemented.

The mobile station (advanced mobile station; AMS) and the base station (advanced base station; ABS) include antennas 500 and 510 for transmitting and receiving information, data, a signal and/or a message, transmission (Tx) modules 540 and 550 for controlling the antennas so as to transmit messages, reception (Rx) modules 560 and 570 for controlling the antennas so as to receive messages, memories 580 and 590 for storing information associated with communication therebetween, and processors 520 and 530 for controlling the Tx modules, the Rx modules and the memories, respectively. At this time, the base station may be a femto base station or a macro base station.

The antennas 500 and 510 serve to transmit the signals generated by the Tx modules 540 and 550 to external devices or receive Radio Frequency (RF) signals from external devices and send the RF signals to the Rx modules 560 and 570. If a MIMO function is supported, two or more antennas may be included.

The processors 520 and 530 generally control the overall operations of the mobile station and the base station, respectively. In particular, the processors may perform a control function for implementing the above-described embodiments of the present invention, a Medium Access Control (MAC) frame variable control function for service characteristics and propagation environments, and an authentication and encryption function. The processors 520 and 530 may further include encryption modules for controlling encryption of various messages and timer modules for controlling transmission and reception of various messages, respectively.

The processor 530 of the mobile station performs reverse repetition coding with respect to first uplink control information and performs joint coding with respect to the reverse repetition coded first uplink control information and second uplink control information.

The Tx modules 540 and 550 may perform predetermined coding and modulation with respect to signals and/or data which are scheduled by the processors and are transmitted to the external devices, and send the signals and/or data to the antennas 500 and 510.

The Rx modules 560 and 570 may perform decoding and demodulation with respect to the RF signals received from the external devices through the antennas 500 and 510, restore the signals to the format of original data, and send the signals to the processors 520 and 530.

The memories 580 and 590 may store programs for processing and control of the processors and perform a function for temporarily storing input/output data (in the case of the mobile station, the uplink (UL) grant allocated by the base station, system information, a station identifier (STID), a flow identifier (FID), an action time, regional-location information, frame offset information, etc.).

In addition, the memories may include at least one storage medium such as a flash memory type, hard disk type, multimedia card micro type and card type memory (e.g., an SD or XD memory), a Random Access Memory (RAM), a Static Random Access Memory (SRAM), a Read-Only Memory (ROM), an Electrically Erasable Programmable Read-Only Memory (EEPROM), a Programmable Read-Only Memory (PROM), a magnetic memory, a magnetic disk, and an optical disc.

The detailed description of the exemplary embodiments of the present invention has been given to enable those skilled in the art to implement and practice the invention. Although the invention has been described with reference to the exemplary embodiments, those skilled in the art will appreciate that various modifications and variations can be made in the present invention without departing from the spirit or scope of the invention described in the appended claims. For example, those skilled in the art may use each construction described in the above embodiments in combination with each other.

Accordingly, the invention should not be limited to the specific embodiments described herein, but should be accorded the broadest scope consistent with the principles and novel features disclosed herein.

Mode for the Invention

Various embodiments have been described in the best mode for carrying out the invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method for transmitting uplink control information in a mobile station of a wireless communication system, the method comprising:
   reverse repetition coding first uplink control information;
   joint coding the reverse repetition coded first uplink control information and second uplink control information, and
   transmitting the joint coded-reverse repetition coded first uplink control information and second uplink control information,
   wherein the first uplink control information has higher priority than the second uplink control information,
   the reverse repetition coding is performed by alternately repeating a bit or a bit sequence of the first uplink control information and a reversed bit or a reversed bit sequence of the first uplink control information, and
   the joint coding is performed by joining the reverse repetition coded first uplink control information and second uplink control information in order or in reverse.

2. The method according to claim 1, wherein the first uplink control information and the second uplink control information are transmitted in one transmission format.

3. The method according to claim 2, wherein the reverse repetition coding includes reverse repetition coding the first uplink control information such that the number of bits of the reversed repetition code first uplink control information becomes a predetermined number of bits.

4. The method according to clam 3, wherein the predetermined number is set in consideration of a maximum payload size supportable by channel coding defined in the transmission format.

5. The method according to claim 2, wherein the reverse repetition coding includes reverse repetition coding the first uplink control information such that a sum of the numbers of bits of the reversed repetition coded first uplink control information and the second uplink control information becomes a predetermined number of bits.

6. The method according to claim 1, wherein the first uplink control information is a Scheduling Request (SR) and the second uplink control information is an Acknowledgement/Non-Acknowledgement (ACK/NACK) signal.

7. The method according to claim 6, wherein the first uplink control information is set to 1 if a scheduling request is present as positive Scheduling Request (SR) transmission in the mobile station and is set to 0 if the scheduling request is absent as negative Scheduling Request (SR) transmission in the mobile station.

8. The method according to claim 1, wherein the first uplink control information is a Scheduling Request (SR) and the second uplink control information is a Channel Quality Indicator (CQI).

9. The method according to claim 1, wherein the first uplink control information is an Acknowledgement/Non-Acknowledgement (ACK/NACK) signal and the second uplink control information is a Channel Quality Indicator (CQI).

10. A mobile station of a wireless communication system, comprising:
    a processor configured to reverse repetition code first uplink control information and joint code the reverse repetition coded first uplink control information and second uplink control information; and
    a transmission module configured to transmit the joint coded-reverse repetition coded first uplink control information and second uplink control information,
    wherein the first uplink control information has higher priority than the second uplink control information,
    the reverse repetition coding is performed by alternately repeating a bit or a bit sequence of the first uplink control information and a reversed bit or a reversed bit sequence of the first uplink control information, and
    the joint coding is performed by joining the reverse repetition coded first uplink control information and second uplink control information in order or in reverse.

11. The mobile station according to claim 10, wherein the first uplink control information and the second uplink control information are transmitted in one transmission format.

12. The mobile station according to claim 11, wherein the reverse repetition coding is performed such that the number of bits of the reverse repetition coded first uplink control information becomes a predetermined number of bits.

13. The mobile station according to clam 12, wherein the predetermined number is set in consideration of a maximum payload size supportable by channel coding defined in the transmission format.

14. The mobile station according to claim 11, wherein the reverse repetition coding is performed such that a sum of the numbers of bits of the reverse repetition coded first uplink control information and the second uplink control information becomes a predetermined number of bits.

15. The mobile station according to claim 10, wherein the first uplink control information is a Scheduling Request (SR) and the second uplink control information is an Acknowledgement/Non-Acknowledgement (ACK/NACK) signal.

16. The mobile station according to claim 15, wherein the first uplink control information is set to 1 if a scheduling request is present as positive Scheduling Request (SR) transmission in the mobile station and is set to 0 if the scheduling request is absent as negative Scheduling Request (SR) transmission in the mobile station.

17. The mobile station according to claim 10, wherein the first uplink control information is a Scheduling Request (SR) and the second uplink control information is a Channel Quality Indicator (CQI).

18. The mobile station according to claim 10, wherein the first uplink control information is an Acknowledgement/Non-Acknowledgement (ACK/NACK) signal and the second uplink control information is a Channel Quality Indicator (CQI).

* * * * *